(12) United States Patent
Ansari et al.

(10) Patent No.: US 10,304,621 B2
(45) Date of Patent: May 28, 2019

(54) BOBBIN WITH ELECTROMAGNETIC INTERFERENCE SHIELD FOR ELECTROMAGNETIC DEVICE

(71) Applicant: Lear Corporation, Southfield, MI (US)

(72) Inventors: Ajmal Imran Ansari, Canton, MI (US); David A. Hein, Sterling Heights, MI (US); Steven Cong, Southfield, MI (US); Allen Leo Mott, Livonia, MI (US)

(73) Assignee: Lear Corporation, Southfield, MI (US)

( * ) Notice: Subject to any disclaimer, the term of this patent is extended or adjusted under 35 U.S.C. 154(b) by 170 days.

(21) Appl. No.: 15/413,640

(22) Filed: Jan. 24, 2017

(65) Prior Publication Data
US 2018/0211766 A1   Jul. 26, 2018

(51) Int. Cl.
| | |
|---|---|
| *H01F 27/22* | (2006.01) |
| *H01F 27/32* | (2006.01) |
| *H01F 27/28* | (2006.01) |
| *H01F 27/36* | (2006.01) |

(52) U.S. Cl.
CPC .......... *H01F 27/325* (2013.01); *H01F 27/22* (2013.01); *H01F 27/2876* (2013.01); *H01F 27/2885* (2013.01); *H01F 27/362* (2013.01)

(58) Field of Classification Search
CPC .................................................. H01F 27/00–36
USPC .................... 336/65, 90, 92, 96, 200, 232
See application file for complete search history.

(56) References Cited

U.S. PATENT DOCUMENTS

| | | | | |
|---|---|---|---|---|
| 2,183,355 | A * | 12/1939 | Mauerer ............... | H01F 27/367 174/51 |
| 2,904,762 | A * | 9/1959 | Schulz .................. | H01F 27/362 336/171 |
| 3,168,716 | A * | 2/1965 | Szalay .................. | H01F 17/043 336/120 |
| 3,851,287 | A * | 11/1974 | Miller .................... | H01F 27/325 336/183 |
| 3,921,113 | A * | 11/1975 | Schiemann ............. | H01F 38/30 336/174 |
| 5,420,559 | A | 5/1995 | Ohshiba et al. | |
| 5,533,249 | A | 7/1996 | Wakeman | |
| 5,659,251 | A * | 8/1997 | Wakamatsu ......... | G01N 27/023 324/204 |
| 6,585,181 | B2 | 7/2003 | Kronenberger | |

(Continued)

OTHER PUBLICATIONS

Butler Winding, Custom Electronic Transformers & Inductors, Bobbin Wound Transformer Theory, http://www.butlerwinding.com/bobbin-wound-transformer-theory/, Date: Mar. 30, 2016.

(Continued)

*Primary Examiner* — Tuyen T Nguyen
(74) *Attorney, Agent, or Firm* — Brooks Kushman P.C.

(57) ABSTRACT

An assembly includes a metallic housing, an electromagnetic (EM) device, and a bobbin in which the EM device is supported. The bobbin has a non-metallic, inner bobbin body, a non-metallic, outer bobbin body, and a metallic shield sandwiched between the inner and outer bobbin bodies. The EM device and the bobbin are mounted in the housing with the bobbin being between the EM device and the housing for heat from the EM device to thermally conduct through the inner and outer bobbin bodies and the shield to the housing while the shield shields noise of the EM device from the housing.

13 Claims, 5 Drawing Sheets

(56) References Cited

U.S. PATENT DOCUMENTS

| | | | |
|---|---|---|---|
| 6,593,836 | B1 | 7/2003 | LaFleur et al. |
| 6,600,402 | B1 | 7/2003 | LaFleur et al. |
| 8,054,152 | B2 | 11/2011 | Tseng et al. |
| 9,897,631 | B2 * | 2/2018 | Contini ................. G01R 31/07 |
| 2011/0116197 | A1 * | 5/2011 | Zylstra ................ G01R 15/183 |
| | | | 361/42 |

OTHER PUBLICATIONS

Cosmo, Coil Bobbin Catalog and Design Manual, www.cosmocorp.com, Date: Unknown.

Joe Casmero and Rich Barden, Transformer Bobbin and Core Selection Involves Interdisciplinary Design and Cost Issues, http://www.lodestonepacific.com/bobbinarticle.php, Copyright 2016 Lodestone Pacific.

China Professional Ferrite Core Supplier, Transformer bobbin ee plastic bobbins coil bobbin ee 25 bobbin, etc., Name: YX-1006; Series: EE, Specification:L YX-1006.pdf, Issue Time: Mar. 9, 2005, Name: YX-1301, Series: EE, Issue Time: Mar. 9, 2005, http://www.magnet-tech.com/core/bobbin/ee.htm.

Electronics/Transformer Design, Wikibooks, open books for an open world, http://en.wikibooks.org/wiki/Electronics/Transformer_Design, Date: Sep. 21, 2015.

\* cited by examiner

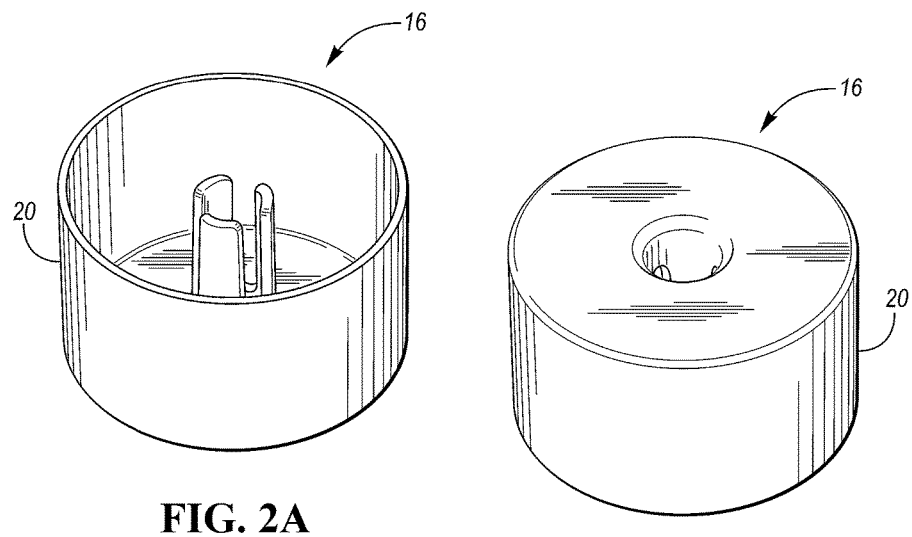
FIG. 2A
FIG. 2B
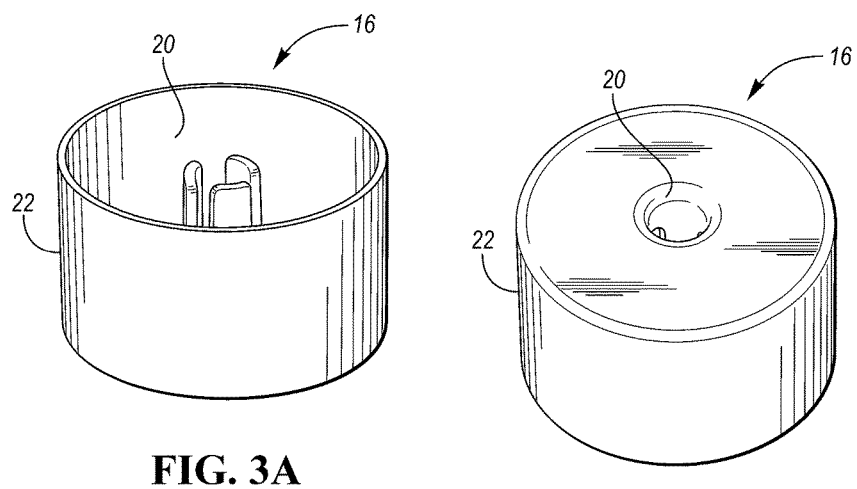
FIG. 3A
FIG. 3B

BOBBIN WITH ELECTROMAGNETIC INTERFERENCE SHIELD FOR ELECTROMAGNETIC DEVICE

TECHNICAL FIELD

The present invention relates to devices for shielding electromagnetic noise generated by electromagnetic devices.

BACKGROUND

An inductor and a transformer are examples of electromagnetic ("EM") devices. An EM device may generate EM noise while operating. It may be desired to shield the EM noise generated by the EM device from an external environment.

SUMMARY

An assembly includes a metallic housing, an electromagnetic (EM) device, and a bobbin having a non-metallic, inner bobbin body, a non-metallic, outer bobbin body, and a metallic shield sandwiched between the inner and outer bobbin bodies. The EM device is supported in the bobbin. The EM device with the bobbin is mounted in the housing with the bobbin being between the EM device and the housing for heat from the EM device to thermally conduct through the inner and outer bobbin bodies and the shield to the housing while the shield shields noise of the EM device from the housing.

In an embodiment, the inner and outer bobbin bodies are of a thermally conductive plastic. The shield may be at least one of nickel, tungsten, copper, aluminum, and iron. The shield may be an electro-plate or a wire mesh. The shield has a thickness dependent on a metal of the shield and on frequency of the EM noise generated by the EM device. A thermally conductive potting material may be provided to fill in space between the outer bobbin body and the housing. The housing may further include a metallic pocket with the EM device and the bobbin being mounted in the pocket of the housing.

A bobbin includes a non-metallic, inner bobbin body configured to receive an electromagnetic (EM) device, a non-metallic, outer bobbin body, and a metallic shield sandwiched between the inner and outer bobbin bodies.

In an embodiment, the outer bobbin body includes openings through which the shield is exposed. The bobbin may further include a thermally conductive potting material filling in the openings of the outer bobbin body.

An assembly includes a metallic housing, an EM device, and a bobbin having an inner metallic shield and a non-metallic, outer bobbin body. The EM device is supported in the bobbin. The EM device and the bobbin are mounted in the housing with the bobbin being between the EM device and the housing for heat from the EM device to thermally conduct through the shield and the outer bobbin body to the housing while the shield shields noise of the EM device from the housing. The outer bobbin body may include openings through which the shield is exposed.

BRIEF DESCRIPTION OF THE DRAWINGS

FIGS. 2A and 2B respectively illustrate top and bottom side tilted views of the bobbin in an initial partially assembled state, the bobbin in the initial partially assembled state having the inner bobbin body;

FIGS. 3A and 3B respectively illustrate top and bottom side tilted views of the bobbin in an intermediate partially assembled state, the bobbin in the intermediate partially assembled state having the inner bobbin body and the EMI shield on an exterior surface of the inner bobbin body;

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

An electromagnetic ("EM") device (e.g., an inductor, a transformer, etc.) may be part of an electrical assembly having a metallic housing in which the EM device is mounted. The EM device generates EM noise while operating. A problem is that the EM noise may be received by the housing which in turn acts as a radiator of the EM noise to the external environment. A bobbin with an electromagnetic interference ("EMI") shield as disclosed herein shields the EM noise generated by the EM device from the housing. Accordingly, the housing does not act as a radiator of the EM noise generated by the EM device.

The EM device includes a core and windings. The core is typically made from the ferrite family of materials, particularly in high frequency AC systems. Ohmic losses in the windings and magnetic hysteresis losses in the core manifest themselves as thermal losses. The thermal losses, particularly in high power density EM devices, can result in excessive temperature causing the EM device to fail prematurely.

The bobbin with the EMI shield as disclosed herein further functions as a thermal interface between the EM device and the housing to conduct heat from the EM device to the housing while shielding the EM noise generated by the EM device from the housing. The heat in turn radiates away from the housing. Accordingly, the temperature of the EM device is maintained below the excessive temperature.

Figure 1A:
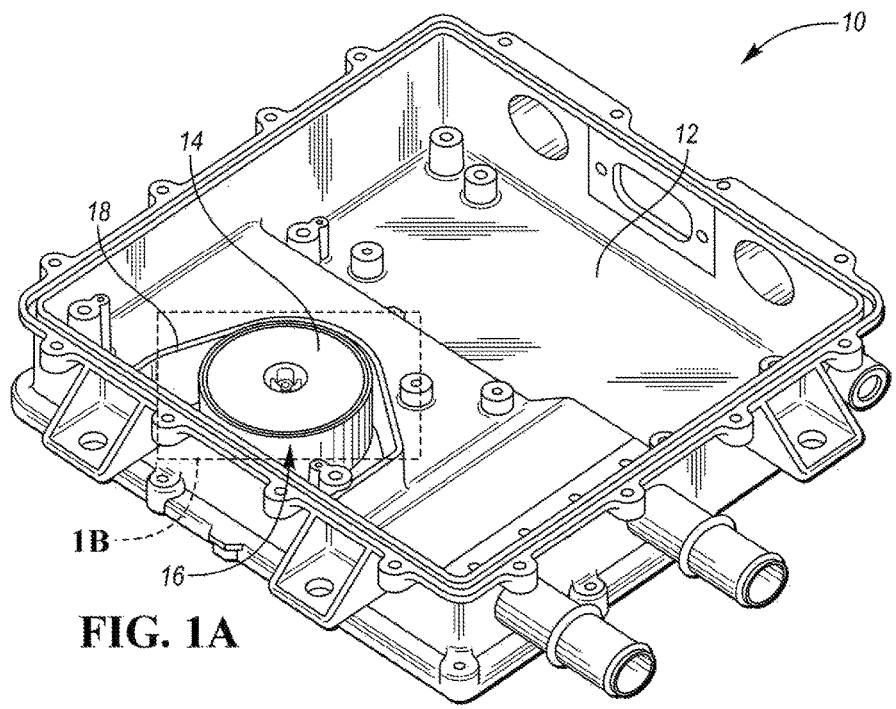
FIG. 1A illustrates a perspective view of an electrical assembly having a housing, an electromagnetic ("EM") device, and a bobbin, the EM device being supported in place in the bobbin and the EM device with the bobbin being mounted in a pocket of the housing, the bobbin having an inner bobbin body, an outer bobbin body, an electromagnetic interference ("EMI") shield sandwiched between the inner and outer bobbin bodies.
Figure 1B:
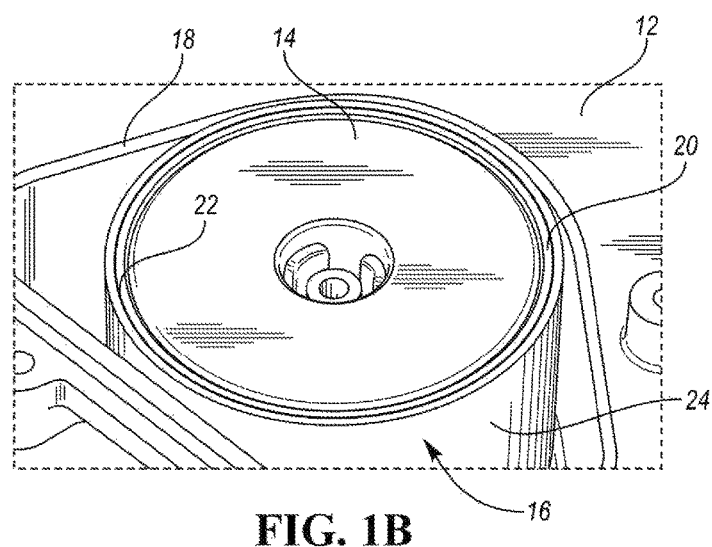
FIG. 1B illustrates an enlarged view of the encircled area 1B of FIG. 1A.

Referring now to FIGS. 1A and 1B, an electrical assembly 10 having a metallic housing 12, an EM device 14, and a bobbin 16 will be described. Bobbin 16 is the bobbin with the EMI shield referred to above. EM device 14 is supported in place in bobbin 16. EM device 14 with bobbin 16 are mounted in a metallic pocket 18 (i.e., a receiving area) of housing 12.

As best shown in FIG. 1B, bobbin 16 includes an inner bobbin body 20, an EMI shield 22, and an outer bobbin body 24. Inner bobbin body 20 and outer bobbin body 24 are non-metallic, thermally conductive parts. For instance, inner bobbin body 20 and outer bobbin body 24 are composed of thermally conductive plastic. EMI shield 22 is a metallic shield in the form of a thin coating of metal such as, for example, aluminum. EMI shield 22 is sandwiched between inner bobbin body 20 and outer bobbin body 24. As such, bobbin 16 is a thermally conductive plastic bobbin having an embedded metallic shield therein.

As shown in FIGS. 1A and 1B, EM device 14 is supported in place in bobbin 16 with the EM device and the bobbin being mounted in metallic pocket 18 of metallic housing 12. Housing 12, for instance, is a metallic housing composed of aluminum. Bobbin 16 is physically between EM device 14 and housing 12. Bobbin 16 thus functions as a thermal interface between EM device 14 and housing 12. Bobbin 16 conducts heat from EM device 14 to housing 12 for the heat generated by the EM device to be radiated away from the housing into the external environment. Bobbin 16 conducts heat from EM device 14 to housing 12 because the components of the bobbin are all thermally conductive. Inner bobbin body 20 and outer bobbin body 24 are thermally conductive as they are composed of thermally conductive plastic and EMI shield 22 is thermally conductive as it is composed of metal.

EMI shield 22 of bobbin 16, which is grounded (not shown), is not in direct contact with EM device 14 as inner bobbin body 20 is between the EM device and the EMI shield. EMI shield 22 is thus electrically isolated by non-metallic inner bobbin body 20 from EM device 14.

EMI shield 22 of bobbin 16 is not in direct contact with housing 12 as outer bobbin body 24 is between the EMI shield and the housing. EMI shield 22 is thus electrically isolated by non-metallic outer bobbin body 24 from housing 12. Accordingly, metallic EMI shield 22 will not function as part of housing 12 as a radiator of EM noise.

EMI shield 22 of bobbin 16 acts as an electromagnetic isolator between EM device 14 and metallic housing 12 and prevents EM noise generated by the EM device, which is supported within bobbin 16 and with the bobbin is mounted in pocket 18 of the housing, from the housing. As such, bobbin 16 with its EMI shield 22 shields EM noise generated by EM device 14 from reaching housing 12. In this way, EM noise transfer from EM device 14 to its surroundings and its accentuation by housing 12 is prevented or at least reduced.

As described, bobbin 16 having non-metallic, thermally conductive inner bobbin body 20 and outer bobbin body 24 and metallic EMI shield 22 embedded between the inner and outer bobbin bodies shields EM noise generated by EM device 14 from housing 12 and thermally conducts heat generated by the EM device to the housing.

Referring now to FIGS. 2A and 2B, 3A and 3B, and 4A and 4B, a process for forming bobbin 16 as a thermally conductive plastic bobbin with EMI shield 22 embedded therein will be described. The process for forming bobbin 16 includes three steps. The first step for forming bobbin 16 involves molding the inner half thickness of bobbin 16 (i.e., first shot of the bobbin). That is, the first step involves forming inner bobbin body 20. Inner bobbin body 20 represents an initial partially assembled state of bobbin 16. FIGS. 2A and 2B respectively illustrate top and bottom side tilted views of bobbin 16 in the initial partially assembled state. As described, bobbin 16 in the initial partially assembled state just has inner bobbin body 20.

The second step for forming bobbin 16 involves coating the molded inner bobbin body 20 with a thin layer of metallic material, like plating. The thin layer of metallic material may be an electroplating or wire mesh. EMI shield 22 is the thin layer of metallic material. EMI shield 22 is coated on an exterior side of inner bobbin body 20. Inner bobbin body 20 and EMI shield 22 represent an intermediate partially assembled state of bobbin 16. FIGS. 3A and 3B respectively illustrate top and bottom side tilted views of bobbin 16 in the intermediate partially assembled state. As described, bobbin 16 in the intermediate partially assembled state just has inner bobbin body 20 and EMI shield 22.

The thickness of EMI shield 22 depends on the choice of metal for the EMI shield and on the AC (alternating current) frequency passing through EM device 14. The thickness of the metallic layer of EMI shield 22 may be in the sub-micron to tens of microns range. The metals of interest include nickel, tungsten, copper, aluminum, and iron and like alloyed materials. In certain cases, the metallic layer can be replaced by a wire mesh with mesh opening and wire size chosen based on the AC frequency and the material of the wire mesh.

Figure 4A:
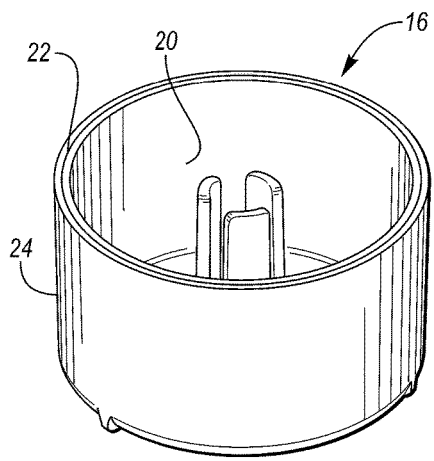
FIGS. 4A and 4B respectively illustrate top and bottom side tilted views of the bobbin in a fully assembled state, the bobbin in the fully assembled state having the inner bobbin body, the EMI shield on the exterior surface of the inner bobbin body, and the outer bobbin body with the EMI shield being sandwiched between the inner bobbin body and the outer bobbin body.
Figure 4B:
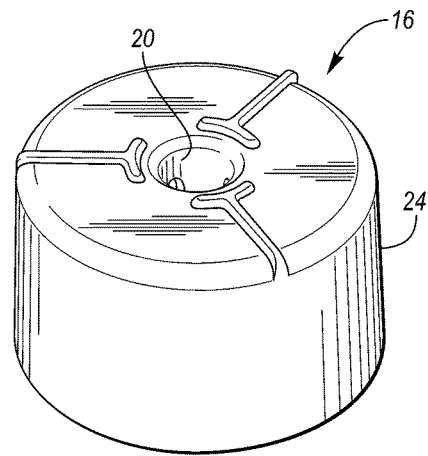

The third step for forming bobbin 16 involves placing the metal plated inner bobbin body 20 in a second molding tool in which the bobbin is brought to its full intended thickness (i.e., second shot of the bobbin). That is, the third step involves forming outer bobbin body 24 onto the metal plated inner bobbin body 20. Inner bobbin body 20 and outer bobbin body 24 with EMI shield 22 therebetween represents the fully assembled state of bobbin 16. FIGS. 4A and 4B respectively illustrate top and bottom side tilted views of bobbin 16 in the fully assembled state. As described, bobbin 16 in the fully assembled state has inner bobbin body 20, EMI shield 22, and outer bobbin body 24 with the EMI shield being sandwiched between the inner bobbin body and the outer bobbin body.

Figure 5A:
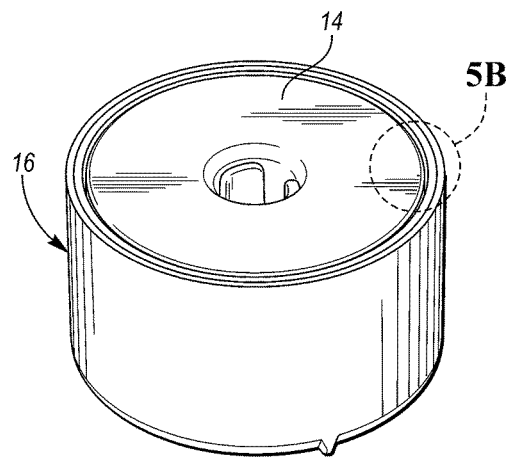
FIG. 5A illustrates a top side tilted view of the EM device and the bobbin with the EM device being supported in place in the bobbin.
Figure 5B:
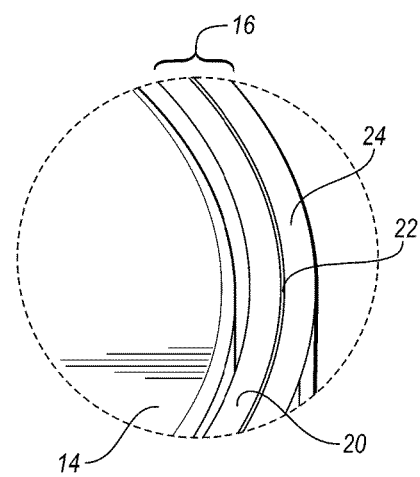
FIG. 5B illustrates an enlarged view of the encircled area 5B of FIG. 5A.

Referring now to FIG. 5A, with continual reference to FIG. 1B, a top side tilted view of EM device 14 and bobbin 16 with the EM device being supported in place in the bobbin is shown. FIG. 5B illustrates an enlarged view of the encircled area 5B of FIG. 5A. As shown in FIGS. 5A and 5B, bobbin 16 encircles EM device 14 with EMI shield 22 being between inner bobbin body 20 and outer bobbin body 24.

Figure 6:
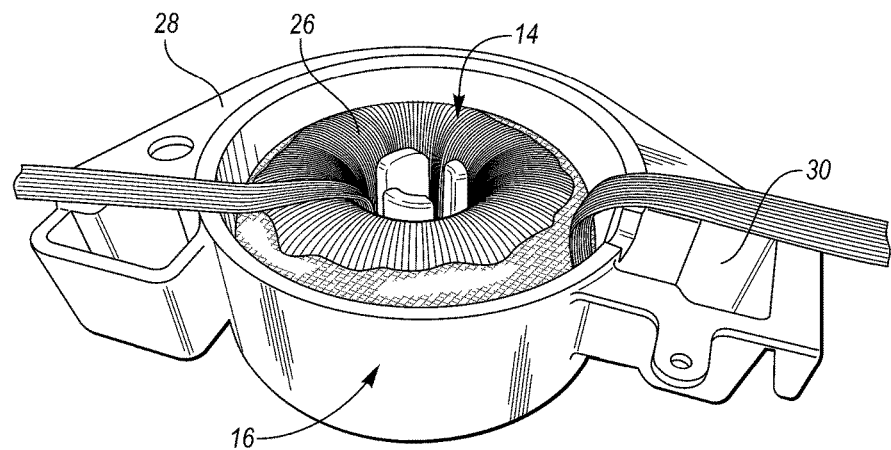
FIG. 6 illustrates a detailed top side tilted view of the EM device and the bobbin with the EM device being supported in place in the bobbin.

Referring now to FIG. 6, a detailed top side tilted view of EM device 14 and bobbin 16 with the EM device being supported in place in the bobbin is shown. Windings 26 of EM device 14 are shown in the detailed view of FIG. 6. Windings 26 are, for instance, enameled copper. Windings 26 are wrapped around a ferrite core (not shown) of EM device 14. In this case, EM device 14 is an inductor in the form of a helical coil winding over a toroidal ferrite. Windings 26 (i.e., the inductor wires) are not trimmed to the proper length in FIG. 6.

Bobbin 16 shown in the detailed view of FIG. 6 is part of a plastic mounting assembly unit 28. Plastic mounting assembly unit 28 is formed from the same thermally conductive plastic as the plastic forming outer bobbin body 24. Plastic mounting assembly unit 28 is molded to fit properly within metallic pocket 18 of housing 12. Plastic mounting assembly unit 28 includes terminal pockets 30 for receiving terminals (the terminals are not installed yet in FIG. 6).

Figure 7:
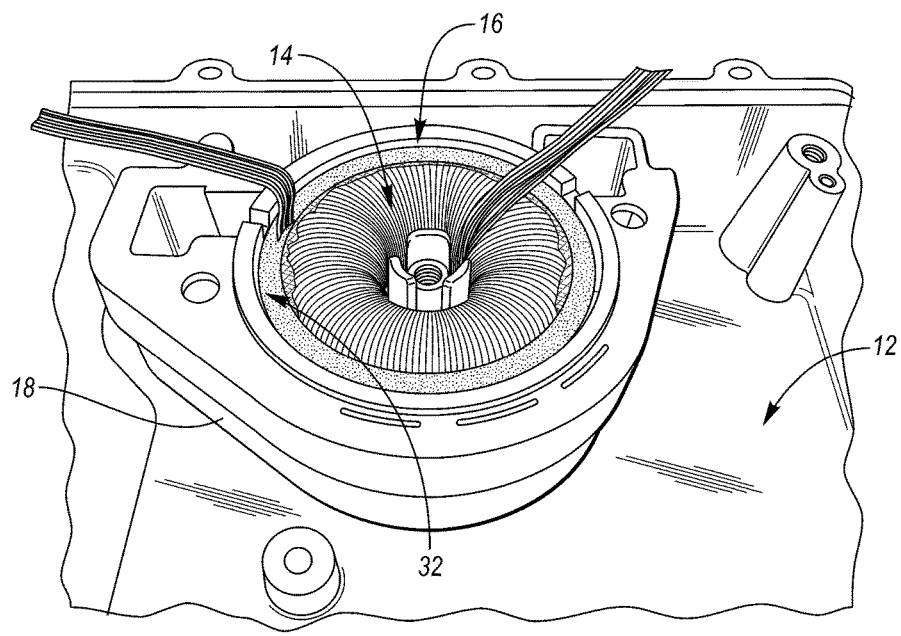
FIG. 7 illustrates a detailed top side tilted view of the EM device, the bobbin, and the pocket of the housing with the EM device being supported in place in the bobbin and the EM device with the bobbin being mounted in the pocket of the housing.

Referring now to FIG. 7, with continual reference to FIG. 6, a detailed top side tilted view of EM device 14, bobbin 16, and metallic pocket 18 of housing 12 with the EM device being supported in place in the bobbin and the EM device with the bobbin being mounted in the pocket of the housing is shown.

As indicated in FIG. 7, an air gap 32 (i.e., empty space) is between EM device 14 (particularly, windings 26) and bobbin 16 (particularly, inner bobbin body 20 of the bobbin). In order to improve thermal contact between EM device 14 and bobbin 16, use may be made of thermal interface materials to fill air gap 32. For instance, thermally conductive potting material may be provided to fill air gap 32 in order to improve thermal contact between EM device 14 and bobbin 16. The potting material enhances heat transfer from EM device 14 to bobbin 16. As described, heat generated by EM device 14 thermally conducts via bobbin 16 to housing 12 to radiate away from the housing into the external environment. The potting material may be any material known in the art suitable for any such purposes (for example, a filled epoxy or filled silicone).

As indicated, EM device 14 as shown in FIGS. 6 and 7 is an inductor in the form of a helical coil winding over a toroidal ferrite. The same concept of EMI shielding with a bobbin having an embedded EMI shield can be applied to toroidal transformers.

Figure 8:
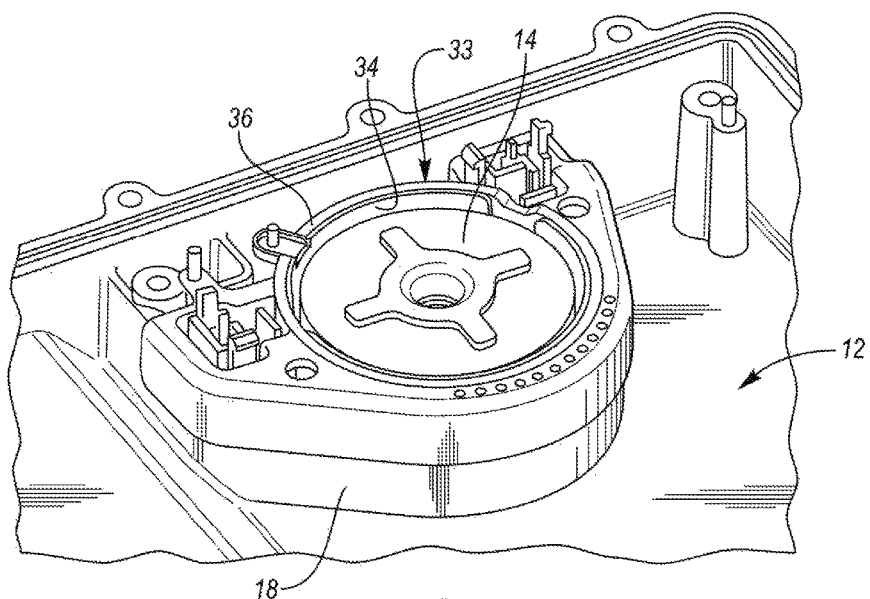
FIG. 8 illustrates a top side tilted view of the EM device and another type of bobbin, the EM device being supported in place in the bobbin and the EM device with the bobbin being mounted in the pocket of the housing, the bobbin having an EMI shield and an outer bobbin body and lacking an inner bobbin body.

Referring now to FIG. 8, a top side tilted view of EM device 14 and another type of bobbin 33 is shown. EM device 14 is supported in place in bobbin 33. EM device 14 and bobbin 33 are mounted in metallic pocket 18 of housing 12. Bobbin 33 includes an EMI shield 34 and an outer bobbin body 36. Bobbin 33 lacks an inner bobbin body. As such, EMI shield 34 is between EM device 14 and outer bobbin body 36.

EMI shield 34 of bobbin 33 is a metallic shield just like EMI shield 22 of bobbin 16. EMI shield 34 serves the same EM noise shielding and thermal conductivity purposes as EMI shield 22. EMI shield 34 may be of the same type and form as EMI shield 22.

Outer bobbin body 36 of bobbin 33 is non-metallic just like outer bobbin body 24 of bobbin 16. EMI shield 34 of bobbin 33 is not in direct contact with housing 12 as outer bobbin body 36 is between the EMI shield and the housing. EMI shield 34 is thus electrically isolated by non-metallic outer bobbin body 36 from housing 12. Accordingly, metallic EMI shield 34 will not function as part of housing 12 as a radiator of EM noise.

Figure 9:
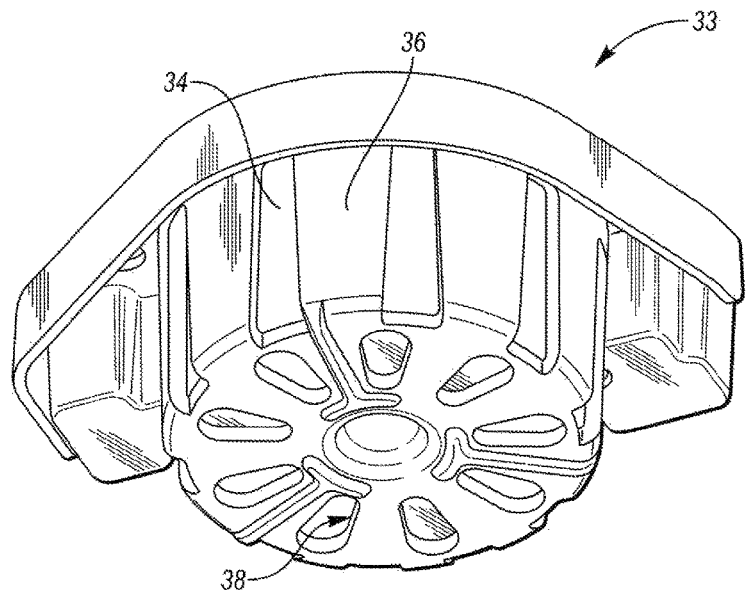
FIG. 9 illustrates a bottom side tilted view of the bobbin shown in FIG. 8.

Outer bobbin body 36 of bobbin 33 may be formed of thermally conductive plastic just like outer bobbin body 24 of bobbin 16. However, outer bobbin body 36 may be formed of other non-metallic materials which may not necessarily be thermally conductive or may be poorly thermally conductive. In this regard, as shown in FIG. 9, outer bobbin body 36 further includes a plurality of openings 38 spread throughout the surface area of the outer bobbin body. Corresponding portions of EMI shield 34 are exposed through openings 38. Heat from EM device 14 may conduct from EMI shield 34 out through openings 38 of outer bobbin body 36 to housing 12. As such, even though outer bobbin body 36 may not be a relatively high thermal conductor by not being formed of thermally conductive plastic, bobbin 33 still functions as a desired type of thermal interface between EM device 14 and housing 12.

Thermally conductive potting material may be provided to fill openings 38 of outer bobbin body 36. The potting material would provide a heat transfer path between EMI shield 34 and housing 12 and thereby enhance heat transfer from EM device 14 to housing 12 via the EMI shield. As mentioned above, the potting material may be any materials known in the art suitable for such purposes (for example, a filled epoxy or filled silicone).

Of course, outer bobbin body 36 may be formed of thermally conductive plastic and have openings 38 which may or may not be filled by potting material. Likewise, outer bobbin body 24 of bobbin 16, which is formed of thermally conductive plastic, may have openings which may or may not be filled by potting material.

Bobbins with built-in EM noise shielding (i.e., EMI shields) for shielding EM noise generated by EM devices have been disclosed. The bobbins shield EM noise generated by EM devices to prevent the EM noise from reaching metallic housings in which the EM devices are mounted. A metallic housing with an EM device and other components are part of an electrical assembly. For instance, the electrical assembly may be the battery charger of a charging system for the traction battery of a vehicle. Such a charging system may be a wireless charging system.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. An assembly comprising:
 a metallic housing;
 an electromagnetic (EM) device having enameled windings wrapped around a magnetic core;
 a bobbin having a non-metallic, inner bobbin body, a metallic shield layered on the inner bobbin body, and a non-metallic, outer bobbin body layered on the shield, the shield being sandwiched between the inner and outer bobbin bodies and the inner bobbin body bounding an interior of the bobbin; and
 wherein the EM device is positioned within the interior of the bobbin with the windings being within the interior of the bobbin and bounded by the inner bobbin body, the EM device with the bobbin are mounted in the housing, and the bobbin is between the EM device and the housing for heat from the EM device to thermally conduct through the inner and outer bobbin bodies and the shield to the housing while the shield shields noise of the EM device from the housing.

2. The assembly of claim 1 wherein:
 the inner and outer bobbin bodies are of a thermally conductive plastic.

3. The assembly of claim 1 wherein:
the shield is of at least one of nickel, tungsten, copper, aluminum, and iron.

4. The assembly of claim 1 wherein:
the shield is one of an electroplate and a wire mesh.

5. The assembly of claim 1 wherein:
the shield has a thickness dependent on a metal of the shield and on frequency of the EM noise generated by the EM device.

6. The assembly of claim 1 further comprising:
a thermally conductive potting material filling in space between the outer bobbin body and the housing.

7. The assembly of claim 1 wherein:
the housing further includes a metallic pocket; and
the EM device with the bobbin are mounted in the pocket of the housing.

8. The assembly of claim 1 wherein:
the assembly is a battery charger for a vehicle.

9. An assembly comprising:
a metallic housing;
an electromagnetic (EM) device having enameled windings wrapped around a magnetic core;
a bobbin having an inner metallic shield and a non-metallic, outer bobbin body layered on the shield, the shield bounding an interior of the bobbin; and
wherein the EM device is positioned within the interior of the bobbin with the windings being within the interior of the bobbin and bounded by the shield, the EM device with the bobbin are mounted in the housing, and the bobbin is between the EM device and the housing for heat from the EM device to thermally conduct through the shield and the outer bobbin body to the housing while the shield shields noise of the EM device from the housing.

10. The assembly of claim 9 wherein:
the outer bobbin body is of a thermally conductive plastic.

11. The assembly of claim 9 wherein:
the outer bobbin body includes a plurality of openings through which the shield is exposed.

12. The assembly of claim 9 wherein:
the shield is of at least one of nickel, tungsten, copper, aluminum, and iron.

13. The assembly of claim 9 wherein:
the shield is one of an electroplate and a wire mesh.

\* \* \* \* \*